(12) United States Patent
Mukaibara

(10) Patent No.: US 8,957,507 B2
(45) Date of Patent: Feb. 17, 2015

(54) TECHNOLOGY OF REDUCING RADIATION NOISE OF SEMICONDUCTOR DEVICE

(75) Inventor: Takuya Mukaibara, Susono (JP)

(73) Assignee: Canon Kabushiki Kaisha, Tokyo (JP)

( * ) Notice: Subject to any disclaimer, the term of this patent is extended or adjusted under 35 U.S.C. 154(b) by 1156 days.

(21) Appl. No.: 12/908,288

(22) Filed: Oct. 20, 2010

(65) Prior Publication Data

US 2011/0095406 A1    Apr. 28, 2011

(30) Foreign Application Priority Data

Oct. 26, 2009   (JP) ................ 2009-245931

(51) Int. Cl.
*H01L 23/495*   (2006.01)
*H01L 23/66*   (2006.01)
*H05K 1/02*   (2006.01)

(52) U.S. Cl.
CPC .......... *H01L 23/49541* (2013.01); *H01L 23/66* (2013.01); *H01L 2924/3011* (2013.01); *H05K 1/0243* (2013.01); *H01L 2224/48247* (2013.01); *H01L 2224/49171* (2013.01); *H01L 2924/30107* (2013.01)
USPC ........... 257/666; 257/690; 257/692; 257/734; 257/778; 257/786

(58) Field of Classification Search
CPC ... H01L 21/4821; H01L 23/495; H01L 23/52; H01L 23/49537; H01L 23/49575; H01L 23/49541; H01L 2224/48247; H01L 2224/49171; H01L 23/66
USPC ......... 257/666, 672, 690, 692, 734, 773, 778, 257/786
See application file for complete search history.

(56) References Cited

U.S. PATENT DOCUMENTS

| 5,132,806 A | 7/1992 | Kitamura et al. | 386/300 |
|---|---|---|---|
| 6,624,509 B2 | 9/2003 | Takikawa et al. | 257/692 |
| 7,312,511 B2 | 12/2007 | Danno et al. | 257/503 |
| 2007/0200218 A1 | 8/2007 | Mukaibara | 257/692 |
| 2009/0200649 A1 * | 8/2009 | Tanaka et al. | 257/676 |

FOREIGN PATENT DOCUMENTS

JP          5-055305 A       3/1993

OTHER PUBLICATIONS

Office Action issued Oct. 15, 2012 by the P.R. China Patent Office in counterpart Chinese patent application 201010522620.3 (with translation).

* cited by examiner

*Primary Examiner* — Ha Tran T Nguyen
*Assistant Examiner* — Suberr Chi
(74) *Attorney, Agent, or Firm* — Fitzpatrick, Cella, Harper & Scinto

(57) ABSTRACT

A first lead frame group is constituted by a plurality of lead frames that are connected to the first circuit, terminals of the plurality of lead frames being provided on a first side of the semiconductor device. A second lead frame group is constituted by a plurality of lead frames that are connected to the second circuit, terminals of the plurality of lead frames being provided on a second side of the semiconductor device. A suspension lead for suspending a die pad that supports the semiconductor chip, the suspension lead being arranged from a corner portion that is formed by the first side and the second side toward the semiconductor chip. Among a group of the terminals of the first lead frame group that are provided on the first side, a terminal on the corner portion side is a terminal for inputting or outputting a signal with a high frequency.

12 Claims, 7 Drawing Sheets

TECHNOLOGY OF REDUCING RADIATION NOISE OF SEMICONDUCTOR DEVICE

BACKGROUND OF THE INVENTION

1. Field of the Invention

The present invention relates to a semiconductor device and a printed board on which the semiconductor device is mounted, and particularly relates to technology of reducing radiation noise of the semiconductor device.

2. Description of the Related Art

Due to miniaturization in semiconductor process technology, the scale of circuits mounted on semiconductor chips has been dramatically increased. Accordingly, it is possible to mount many functional portions on one chip. In order to realize this, it is necessary to increase the number of external lead terminals of a semiconductor package, to further narrow the pitch between terminals, and to also narrow the width of inner leads constituted inside the semiconductor package. Japanese Patent Laid-Open No. 5-055305 proposes using connection terminals closest to the four corners of an LSI chip as connection terminals for a power source circuit, and causing the length of conductor leads connected to these terminals to be the shortest among the lengths of a plurality of conductor leads with which the mounting package is provided.

According to Japanese Patent Laid-Open No. 5-055305, the length of the conductor leads connected to the connection terminals close to the four corners needs to be set shorter than the length of conductor leads connected to connection terminals that are farther from the four corners (that is, in the center portion of each side of the package). Therefore, the arrangement direction of the tip portions of the inner leads needs to form a 30 to 45-degree angle relative to the arrangement direction of the outer leads. However, if the size of a semiconductor package is large compared to the area of the semiconductor chip (for example, the case where one side of a 256-pin QFP package is about 30 mm, and one side of a semiconductor chip is about 7 mm), the effect of reducing the length of inner leads decreases. Further, since the width of the individual inner leads and the interval between the inner leads are extremely narrow, high frequency coupling due to parasitic capacitance components formed between neighboring inner leads and noise interference due to mutual inductance may occur.

SUMMARY OF THE INVENTION

A feature of the present invention is to suppress propagation of a high frequency component of a certain signal to other inner leads as noise due to, for example, mutual inductance and capacitive coupling between adjacent inner leads, and radiation from this noise.

A semiconductor device of the present invention may comprise the following elements. A semiconductor chip includes a first circuit including connection terminals for inputting or outputting a signal with a first frequency, and a second circuit including connection terminals for inputting or outputting a signal with a second frequency that is lower than the first frequency. A first lead frame group is constituted by a plurality of lead frames that are connected to the first circuit, terminals of the plurality of lead frames being provided on a first side of the semiconductor device. A second lead frame group is constituted by a plurality of lead frames that are connected to the second circuit, terminals of the plurality of lead frames being provided on a second side of the semiconductor device. A suspension lead for suspending a die pad that supports the semiconductor chip, the suspension lead being arranged from a corner portion that is formed by the first side and the second side toward the semiconductor chip. Among a group of the terminals of the first lead frame group that are provided on the first side, a terminal on the corner portion side is a terminal for inputting or outputting a signal with a high frequency.

Further features of the present invention will become apparent from the following description of exemplary embodiments with reference to the attached drawings.

DESCRIPTION OF THE EMBODIMENTS

Hereinafter, some embodiments of the present invention are described more specifically and in detail with reference to the accompanying drawings. Semiconductor devices described below in the embodiments are ASICs (application specific integrated circuits) including integrated circuits with tens of thousands gates to hundreds of thousands gates, for example. First, a lead frame of a semiconductor device is briefly described, and high frequency coupling in a lead frame portion is described.

Embodiment 1

Description of Lead Frame

Figure 1:
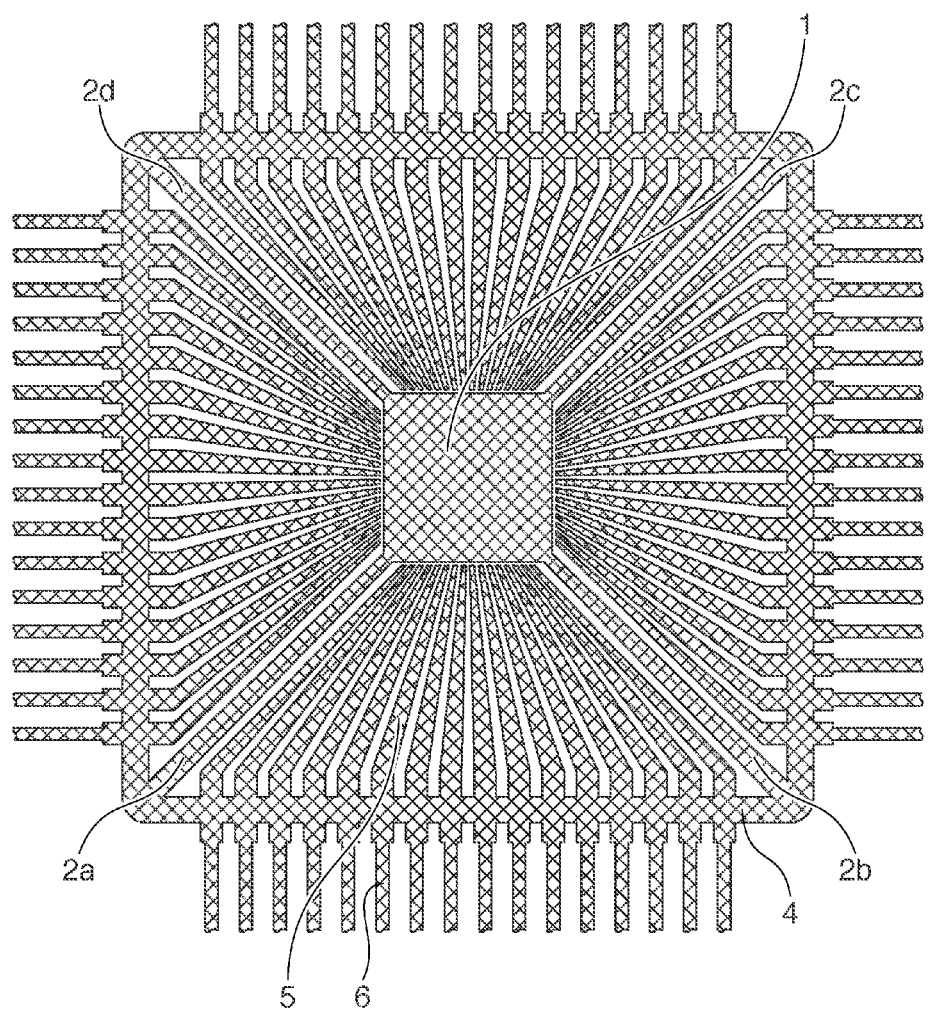
FIG. 1 is a diagram showing a lead frame of a semiconductor device in a simplified manner.

FIG. 1 is a diagram showing the configuration of a lead frame of a semiconductor device in a simplified manner, which is a typical embodiment of the present invention. For convenience of the description, a 64-pin QFP package that has a comparatively small number of pins is shown as an example of a semiconductor device. This semiconductor device is provided with 16 lead terminal pins on each side.

The lead frame is formed of a conductor such as metal. This lead frame is constituted by a die pad 1, suspension leads 2a to 2d, inner leads 5, outer leads 6, and a tie bar 4. The die pad 1 is a support member for supporting a semiconductor chip. The suspension leads 2a to 2d suspend the die pad 1. The inner leads 5 and the outer leads 6 are each a lead for connecting the semiconductor chip and the outside. The suspension leads 2a to 2d are leads arranged from the corner portions that are each formed by one side and another side toward the interior of the semiconductor device. Note that the inner leads 5 are leads on the inner side relative to the tie bar 4 or a resin molding, and the outer leads 6 are leads on the outer side. The number of the inner leads 5 and the outer leads 6 corresponds to the number of pins of the package. In the present embodiment, 16 of each are provided on each side, that is, 64 pins in total. The inner leads 5 and the outer leads 6 are linked by the tie bar 4. The die pad 1 is linked to the tie bar 4 via the suspension leads 2a to 2d.

Figure 2:
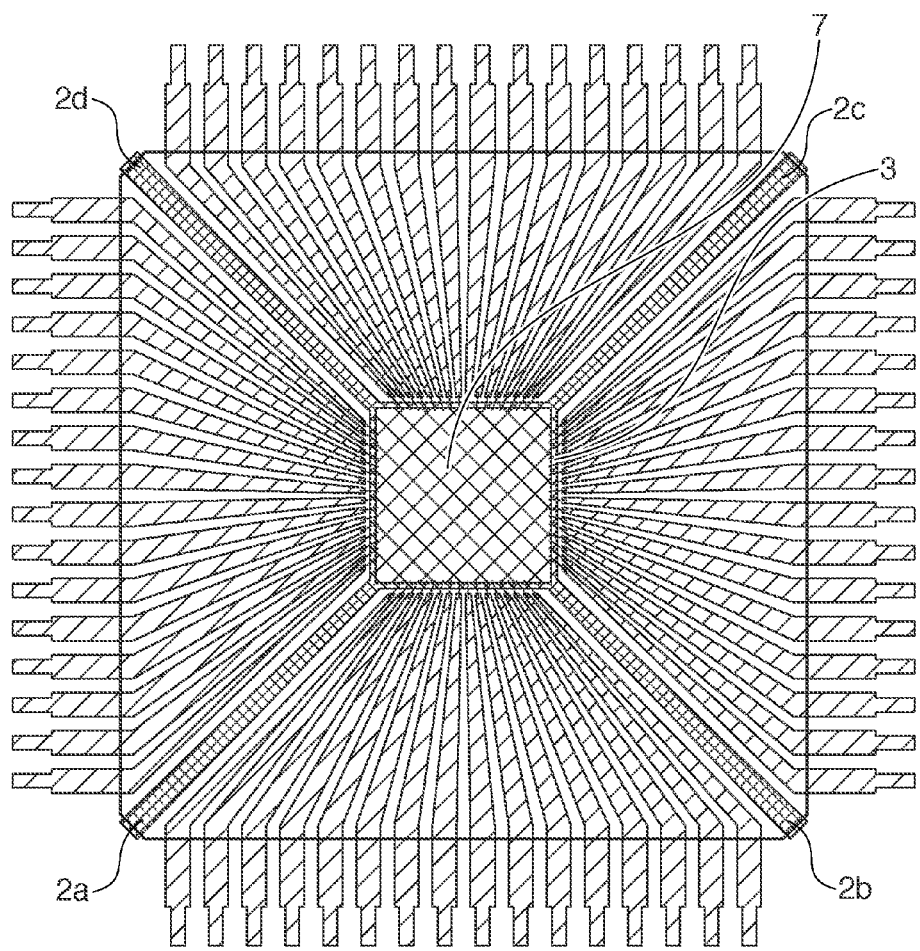
FIG. 2 is a diagram showing the internal configuration of the semiconductor device in a simplified manner.

Next, the state after packaging is shown in FIG. 2. When a semiconductor device is manufactured, a semiconductor chip 7 is mounted on the die pad 1, and electrode pads on the semiconductor chip 7 and the tip portions of the inner leads 5 are connected by bonding wires 3. After that, resin molding seals the portion including the semiconductor chip 7, the bonding wires 3, and the inner leads 5. After being sealed by resin molding, tie-bar cutting is performed to cut off portions of the tie bar 4 between leads, and thereby adjacent outer leads are separated from each other.

Figure 3:
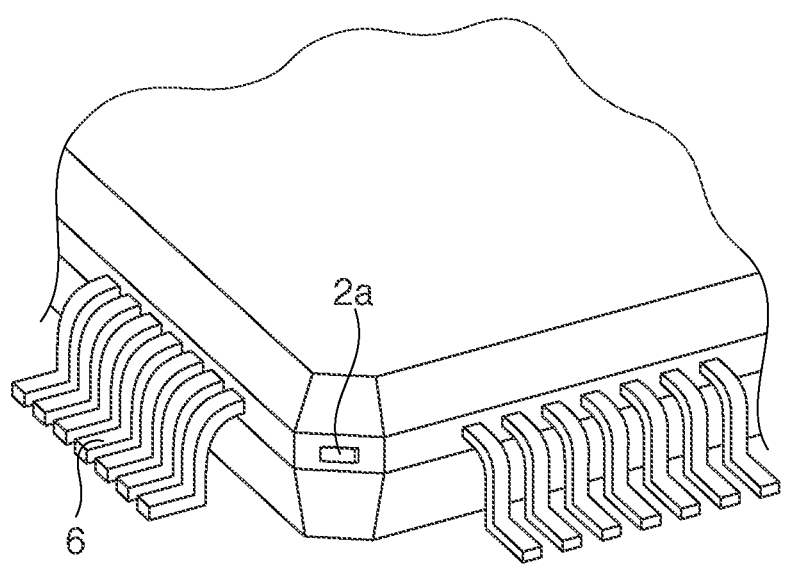
FIG. 3 is a perspective view of a semiconductor package showing a state in which a suspension lead has been tie-bar cut.

The suspension leads 2a to 2d that support the die pad 1 are also separated from the tie bar 4 and the outer leads 6 by the tie-bar cutting. The tie bar 4 is provided such that the inner leads 5 and the outer leads 6 are not in contact with each other, and a fixed interval therebetween is maintained. Further, the tie bar 4 is also provided to prevent filled resin from leaking onto the outer leads 6 in the resin seal manufacturing process. FIG. 3 shows a perspective view showing the state in which the suspension lead 2a has been tie-bar cut after resin sealing. The outer leads 6 are formed so as to function as external lead terminals for connecting the semiconductor device to a printed board. For example, the outer leads 6 are cut to a predetermined lead length, and a bending process is also performed thereon. An external lead terminal may be called an outer lead, a terminal, an external connection terminal, or a pin.

High Frequency Coupling in Lead Frame Portion

Figure 4:
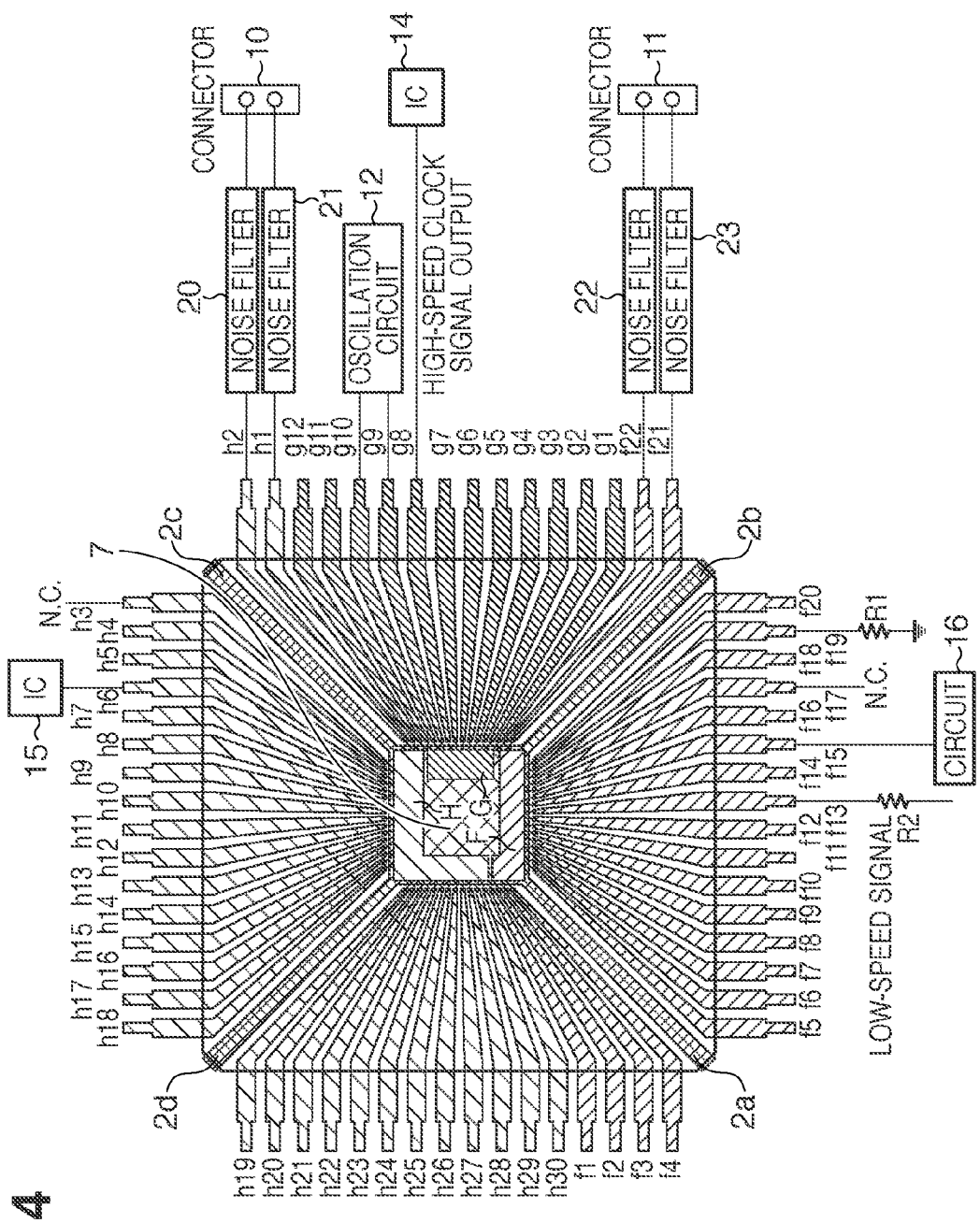
FIG. 4 is a diagram showing a semiconductor device according to Embodiment 1 and circuits that are connected thereto in a simplified manner.

Next, high frequency coupling that occurs in the lead frame portion of the semiconductor device is briefly described with reference to FIG. 4. FIG. 4 shows, in a simplified manner, the semiconductor device described with reference to FIG. 3, and electric circuits, connectors, and the like on a printed board connected to the outer leads (external lead terminals) of the semiconductor device. For convenience of the description, only some electric circuits connected to the semiconductor device are shown in a simplified manner, and other circuits are omitted.

On the semiconductor chip 7 shown in FIG. 4, an internal module and an I/O cell are separated into three blocks. These blocks will be referred to as a circuit block H, a circuit block F, and a circuit block G. The circuit block H is connected to lead frames h1 to h30 by bonding wires. The circuit block F is connected to lead frames f1 to f22 by bonding wires. The lead frames h1 to h30 and the lead frames f1 to f22 are an example of a second lead frame group formed by a plurality of lead frames connected to a second circuit block. The terminals (outer leads) of the lead frames h3 to h18 are provided on the upper side of the semiconductor device in the diagram. The terminals of the lead frames h19 to h30 and f1 to f4 are provided on the left side of the semiconductor device. The terminals of the lead frames f5 to f20 are provided on the lower side of the semiconductor device. Note that the lead frames h1, h2, f21, and f22 are provided on the right side. In FIG. 4, the lead frames h3, f20, and the like correspond to lead frames located in respective end portions of the second lead frame group. Further, the lead frames h1, h2, f21, and f22 correspond to a part of lead frames forming the second lead frame group that are provided on a first side that is the same as the side on which a first lead frame group is provided. In particular, the present invention has a feature that, among a group of the terminals of the first lead frame group that are provided on the first side, a terminal on the corner portion side is a terminal for inputting or outputting a signal with a high frequency.

The circuit block G is connected to lead frames g1 to g12 by bonding wires. The lead frames g1 to g12 are an example of a first lead frame group formed by a plurality of lead frames connected to a first circuit block. The lead frames g1 to g12 are provided on the right side of the semiconductor device. In FIG. 4, the lead frames g1, g12, and the like correspond to lead frames located in respective end portions of the first lead frame group. In this example, the right side corresponds to the first side, and the other sides correspond to second sides. The circuit block G is a circuit that operates at high operating frequencies. For example, the circuit block G has an oscillation circuit 12 that operates at about 20 MHz or more, and an output port for outputting a clock signal with a frequency of about several MHz or more to an IC 14 on the printed board via an external lead terminal. The circuit blocks H and F are circuits that operate at low operating frequencies, and do not have high-speed input output signals that operate at several MHz or more. The circuit block G is an example of a first circuit that is provided with external connection terminals for inputting or outputting signals with a first frequency. Further, the circuit blocks H and F are examples of a second circuit provided with external connection terminals for inputting or outputting signals with a second frequency that is lower than the first frequency. An IC 15 is connected to the lead frame h6 of the circuit block H, and the lead frame h3 is not connected to anything (N.C.). A damping resistor R2 is connected to the lead frame f13 of the circuit block F, a circuit 16 is connected to the lead frame f15, the lead frame f17 is N.C., and a pull-down resistor R1 is connected to the lead frame f19.

Each of these circuit blocks is constituted in the state in which an electric power supply line (power source line) and a GND (grounding) line are separated from each other on the semiconductor chip 7. Specifically, the noise intrusion phenomenon within the semiconductor chip 7 via the power source lines and the ground lines is suppressed. That is, the circuit blocks H and F are separated from the circuit block G that operates at a high speed within the semiconductor chip 7, which prevents noise components from the circuit block G from being coupled within the semiconductor chip 7. However, the lead frames h1 and h2 connected to the circuit block H are adjacent to the lead frames g11 and g12 of the circuit block G, and the lead frames f21 and f22 connected to the circuit block F are adjacent to the lead frames g1 and g2 of the circuit block G. Therefore, there is a possibility that high frequency components of signals related to the circuit block G may be coupled with the lead frames h1, h2, f21, and f22 as noise. If noise filters 20, 21, 22, and 23 are not provided, the noise coupled with the lead frames h1, h2, f21, and f22 will propagate to connectors 10 and 11 mounted on the printed board. Furthermore, such noise will also propagate to the cables connected to the connectors 10 and 11. The noise that has propagated to the cables will be noise that increases spurious radiation. In view of this, it is sufficient to add the noise filters 20 to 23 on the printed board to suppress spurious radiation noise.

On the other hand, it has become clear that even though the lead frames h3 and h4 that are arranged neighboring to the circuit block G after the lead frame h2 are pins next to the lead frame h2, the level of noise coupled from the circuit block G is remarkably low. This shows that coupling of noise that occurs in the lead frame portion greatly depends on the arrangement configuration of inner leads. The inner leads are formed longer the closer a pin, among the pins of the semiconductor package, is to a corner of the semiconductor package. Accordingly, influence due to mutual inductance interference and capacitive coupling between the adjacent inner leads is greater the closer a pin is to a corner formed by two sides.

Note that even in the case of pins whose outer leads are adjacent to each other, with regard to pins adjacent to each other with a corner formed by one side and another side therebetween, a suspension lead is provided between their inner leads. For example, the suspension lead 2c is provided between the lead frames h2 and h3. Thus, with regard to the lead frames h2 and h3, the interval between their inner leads is comparatively large. Therefore, there is a lower possibility that capacitive coupling and mutual inductance interference may become a source of noise. For example, in FIG. 4, the lead frames h2 and h3 that are arranged adjacent to each other on respective sides of the suspension lead 2c correspond to this state.

As described above, the influence of noise due to capacitive coupling and mutual inductance interference can be reduced by an innovation in the pin assignment of the lead frames connected to the circuit block G and signal assignment of the lead frames that are arranged neighboring to the above lead frames. Specifically, a conductor such as a suspension lead is provided from each corner portion that is formed by two sides of a semiconductor package toward a semiconductor chip, and lead frames connected to different circuit blocks are arranged on the sides with such conductors used as borders. When a part of terminals of a plurality of lead frames for a low-speed circuit block are arranged on the same side as and adjacent or neighboring to terminals of lead frames for a high-speed circuit block, noise can be reduced by providing this part of terminals of lead frames with noise filters.

Embodiment 2

Figure 5:
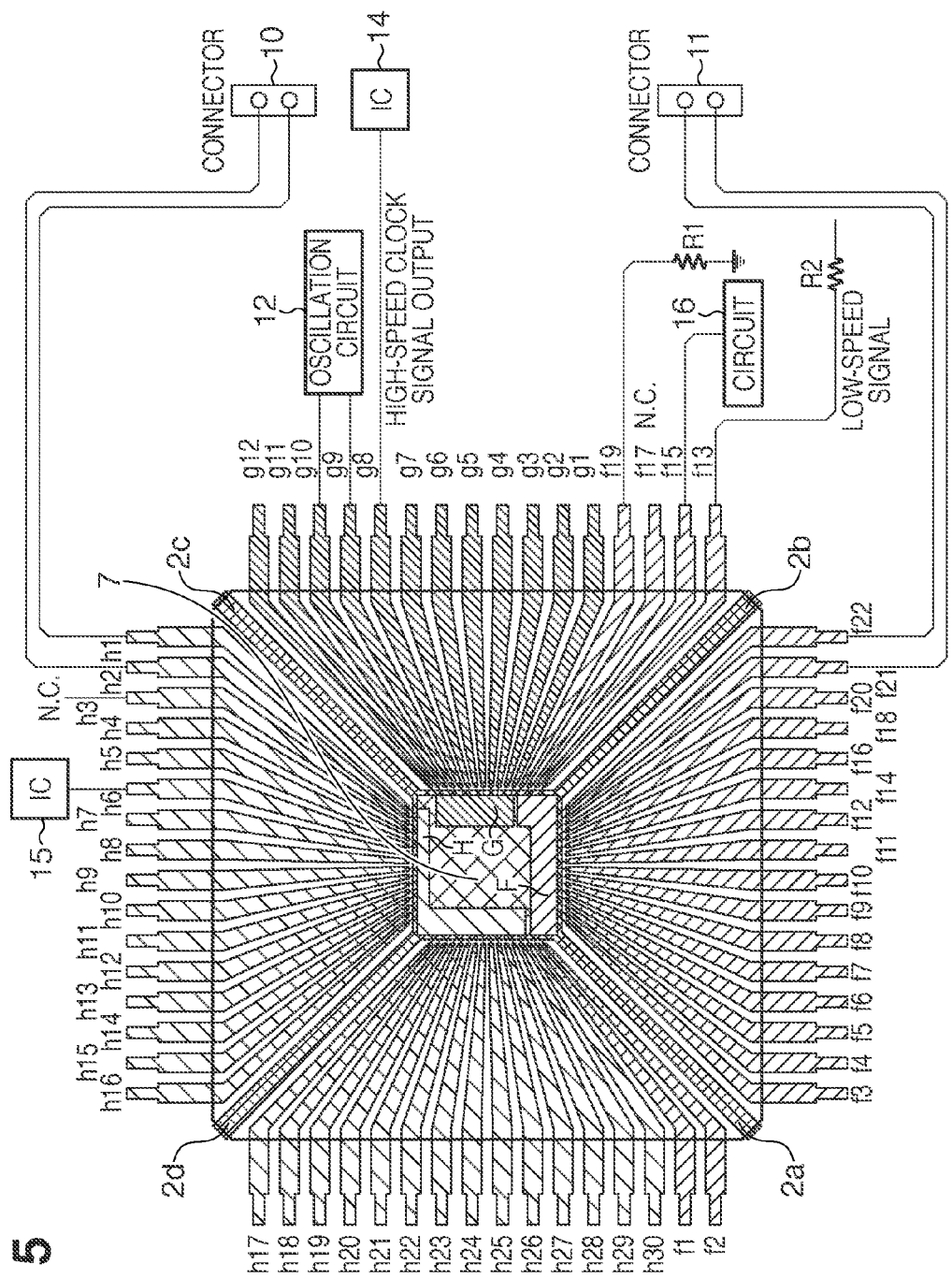
FIG. 5 is a diagram showing a semiconductor device according to Embodiment 2 and circuits that are connected thereto in a simplified manner.

FIG. 5 shows, in a simplified manner, a semiconductor device according to Embodiment 2 and electric circuits, connectors, and the like on a printed board to which external lead terminals of the semiconductor device are connected by wiring. For convenience of the description, only some electric circuits connected to the semiconductor device are shown in a simplified manner, and other circuits are omitted. Note that the description is simplified by giving the same reference numerals to the constituent elements that have already been described. The assignment of signals to the pins of the semiconductor device according to Embodiment 2 shown in FIG. 5 has been changed compared to the semiconductor device according to Embodiment 1 shown in FIG. 4.

The printed board on which the semiconductor device shown in FIG. 5 is mounted is provided with the semiconductor device, the oscillation circuit 12, the IC 14 such as a CPU, the IC 15 and the circuit 16 that are, for example, operational amplifiers, the connectors 10 and 11, the pull-down resistor R1, and the damping resistor R2. The lead frame group for the circuit block H includes the lead frames h1 to h30. The lead frame h1 located in the end portion is a lead frame that is located in one end portion of the second lead frame group, and is arranged at the right end of the upper side among the four sides of the semiconductor device in FIG. 5. That is, the lead frame h1 in the end portion is arranged in the vicinity of the corner formed by, among the four sides of the semiconductor device, the upper and right sides in FIG. 5 and adjacent to the suspension lead 2c. Note that a part of the lead frame group for the circuit block H is arranged on the upper side, and the remaining part thereof is arranged on the left side. The lead frames f1 and f2 for the circuit block F are arranged in the lower end portion of the left side. The lead frames f3 to f22 for the circuit block F are arranged on the lower side, and the remaining lead frames f13, f15, f17, and f19 are arranged on the right side. The lead frames g1 to g12 for the circuit block G are also arranged on the right side. The lead frame g12 corresponds to a lead frame located in one end portion of the first lead frame group. Further, the lead frames f13, f15, f17, and f19 correspond to a part of the terminals of the lead frames that belong to the second lead frame group and are provided on the same side as the first lead frame group.

The IC 14 is connected to the external lead terminal of the lead frame g8, which connects high-speed clock signals to the IC 14. Note that high-speed clock signals are mere examples. It is assumed that, for example, a signal line that operates at a high frequency of about 10 MHz or more is assigned to the external lead terminal of the lead frame g8. The oscillation circuit 12 that oscillates at about 20 MHz or more is connected to the external lead terminals of the lead frames g9 and g10. As also described in "High Frequency Coupling in Lead Frame Portion", signals with high frequency components are assigned to the lead frames g1 to g12 connected to the circuit block G. If signals inputted to and outputted from the lead frames g1 to g12 are closed within the printed board, the problem of spurious radiation will basically not occur with the lead frames g1 to g12. The main signal lines that have great influence on radiation noise are those for signals connected from the printed board to the cables.

One feature of Embodiment 2 is that the lead frames h1, h2, f21, and f22 that are connected to the connectors 10 and 11 to which the cables are connected are assigned to sides different from the side on which the lead frames g1 to g12 are provided. That is, the suspension leads 2c and 2b are interposed between the lead frames g1 to g12 that have high frequency components and the lead frames h1, h2, f21, and f22 connected to the connectors 10 and 11. Thus, since the lead frames h1, h2, f21, and f22, and the lead frames g1 to g12 are arranged with the corner portions that are each formed by one side and another side therebetween, the intervals between these inner leads are comparatively large. Therefore, influence due to capacitive coupling and mutual inductance interference can be reduced. Specifically, it is possible to suppress a phenomenon in which high frequency noise from the lead frames g1 to g12 propagates to the nearby lead frames, and furthermore propagates to the cables, and then is radiated.

On the other hand, since the lead frames f13, f15, f17, and f19 are arranged on the same side as the lead frames g1 to g12 that have high frequency components, noise is likely to propagate thereto due to parasitic capacitance and mutual inductance. In view of this, comparatively low-speed signal lines as described below are assigned to the lead frames f13, f15, f17, and f19, and thus the impedance of signal line output portions can be easily set high, thereby reducing spurious radiation.

For example, a low-speed signal with a frequency of about 100 kHz or less is connected to the lead frame f13. Desirably, a logic signal for mere state transition that does not have any problems even with an operation speed of several ms or more, for instance, is assigned. In the case of such a low-speed signal for which a high operation speed is not required, noise components coupled to the lead frame f13 can be easily attenuated by setting the value of the damping resistor R2 to about 1 kΩ, for example. If the value of the damping resistor R2 is increased, the response speed drops, thereby making the waveform dull; however, the signal is originally a low-speed signal, and thus a problem will not arise. The lead frame f15 is connected to the circuit 16 arranged within the printed board. The circuit 16 is assumed to be a circuit having an input impedance of several kΩ or more, for example. Accordingly, high frequency noise coupled to the lead frame f15 is attenuated in the circuit 16, and hardly propagates to the other portions of the printed board. An N.C. signal, such as a test pin, is assigned to the lead frame f17. That is, since the external lead terminal of the lead frame f17 is open-connected, high frequency noise coupled in the lead frame portion hardly propagates to the printed board. For example, the pull-down resistor R1 whose value is about 10 kΩ is connected to the lead frame f19. High frequency noise coupled to the lead frame f19 is greatly attenuated by the pull-down resistor R1. That is, such noise hardly propagates to the GND pattern of the printed board. Accordingly, there is almost no propagation of high frequency noise to the printed board either. Note that from experimentation, it was found that the effect of reducing high frequency noise is achieved by setting the resistance values of the pull-down resistor R1, the damping resistor R2, the IC 15, and the circuit 16 to 470Ω or more. Further, from experimentation, it was also found that in the case where the frequency of signals that flow into these circuits and elements is 100 kHz or less, even if high frequency noise is attenuated by increasing the value of the damping resistor, the dull waveform that occurs would not easily become a problem.

As described above, according to the present embodiment, lead frames (high frequency lead frames) to which signals that have high frequency components are assigned are arranged beginning from a corner portion of the semiconductor device or in the vicinity thereof. Further, coupling of high frequency noise can be suppressed by arranging a suspension lead between a high frequency lead frame and a lead frame to which a signal that has a low-frequency component (low frequency lead frame) is assigned. Furthermore, the outer lead of a low frequency lead frame arranged on the same side as the outer lead of a high frequency lead frame may be connected to a circuit or an element having a high input impedance. If the outer lead is opened (assumed to be an N.C. signal), the impedance will be infinite, and accordingly the same noise suppression effect can be expected. Thus, high frequency noise from a high frequency lead frame is attenuated by an impedance component of 470Ω or more, and thus the propagation of high frequency noise to the printed board can be suppressed. Furthermore, it is possible to suppress spurious radiation from the connected cables and the like due to the propagation of high frequency noise generated in the semiconductor device to the entire printed board via a pattern on the printed board on which the semiconductor device is mounted. Although a noise filter is interposed between each lead frame that is ultimately connected to a cable and that cable in Embodiment 1, lead frames that are ultimately connected to cables are arranged on a side different from the side on which high frequency lead frames are arranged in Embodiment 2. Therefore, the filter components for radiation noise countermeasures can be eliminated.

Embodiment 3

Figure 6:
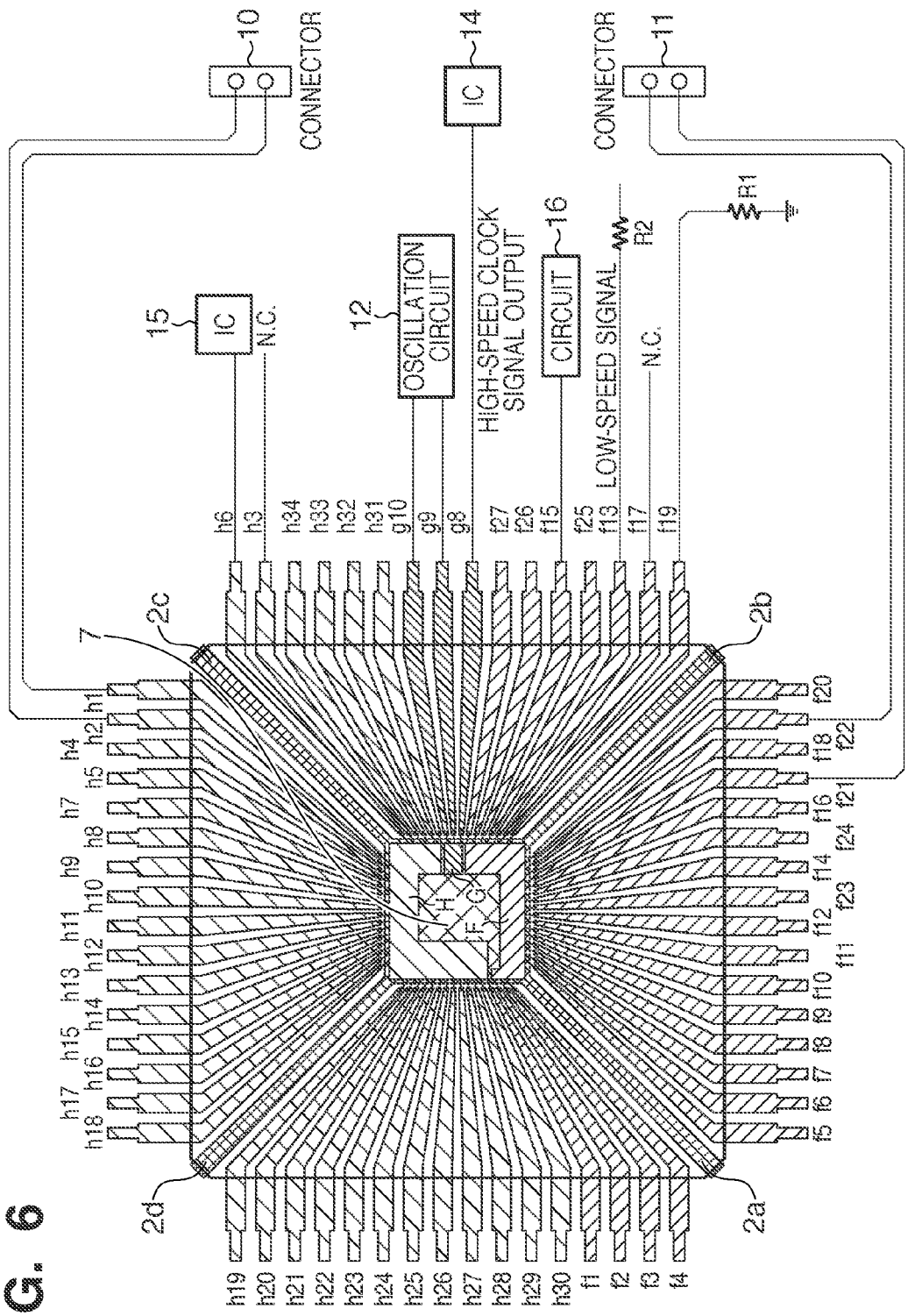
FIG. 6 is a diagram showing a semiconductor device according to Embodiment 3 and circuits that are connected thereto in a simplified manner.

A semiconductor device according to Embodiment 3 has a feature that, for example, a high-speed signal group that operates at a frequency of about 10 MHz or more is assigned in the vicinity of the center portion of a side of the semiconductor device. FIG. 6 shows, in a simplified manner, the semiconductor device, and electric circuits, connectors, and the like on a printed board to which the external lead terminals of the semiconductor device are connected by wiring. For convenience of the description, only some electric circuits connected to the semiconductor device are shown in a simplified manner, and other circuits are omitted. The circuit blocks H, F and G, the lead frames h1 to h34, f1 to f27, and g8 to g10 shown in FIG. 6 are the same as those shown in FIG. 4 except that the number of pins differs, and thus a description thereof is omitted. The description is simplified by giving the same reference numerals to the constituent elements that have already been described.

A comparison of FIGS. 6 and 5 shows that the number of lead frames connected to the circuit block G has decreased. The external lead terminal of the lead frame g8 is connected to the IC 14, and the lead frames g9 and g10 are connected to the oscillation circuit 12, which is the same as in FIG. 5. Accordingly, the lead frames g8 to g10 connected to the circuit block G belong to the first lead frame group, and signals with high frequency components are assigned thereto. Note that the lead frames h3, h6, h31 to h34, f13, f15, f17, f19, and f25 to f27 correspond to a part of the terminals of the lead frames that belong to the second lead frame group and are provided on the same side as the first lead frame group.

The length of the inner leads arranged in the center portion of each side of the semiconductor device is the shortest among the inner leads on that side. That is, the value of the inductance of inner leads arranged in the center portion is smaller than the inductance of the inner leads arranged in the corner portions of the side. More specifically, if instantaneous current flows at the same speed, the voltage drop that occurs is smaller at inner leads in the center portion of the side, and thus the noise level also becomes lower. As in Embodiment 3, if there are a small number of signal lines that operate at a high frequency, the signal lines that operate at a high frequency are assigned in the center portion of the side, thereby enabling reducing voltage drop that occurs. However, other inner leads neighboring to those signal lines that operate at a high frequency are likely to receive coupling of noise due to parasitic capacitance and mutual inductance.

In view of this, with the pin assignment of the lead frames shown in Embodiment 3, the pin assignment of the lead frames that are located on the same side as the outer leads of the lead frames g8 to g10 is the same as that of the lead frames f13, f15, f17, and f19 described in Embodiment 2. Specifically, a signal line connected to a circuit whose impedance can be easily set high is assigned, and thereby it is possible to suppress propagation of high frequency noise to the printed board. Specific description of the circuit is the same as in Embodiment 2, and thus omitted.

According to the present embodiment, a signal having high frequency components is assigned to a lead frame arranged in the vicinity of the center portion of a side of the semiconductor device, and thereby the level of noise that occurs can be suppressed so as to be lower than the case where such a signal is assigned to a lead frame in an end portion of the side. Further, a low-frequency outer lead arranged on the same side as a high-frequency outer lead is connected to a circuit with a high input impedance, or an element whose impedance can be easily set high, or is not connected to anything. Further, the low-frequency outer lead may be a terminal for output of a signal with a frequency of 100 kHz or less, which is the same as in Embodiment 2. Thereby, it is possible to suppress propagation of high frequency noise to the printed board via a low frequency outer lead. As a result, it is possible to suppress propagation of high frequency noise generated in the semiconductor device to the entire printed board via a pattern on the printed board on which the semiconductor device is mounted, and furthermore spurious radiation from cables and the like. Further, the filter components for radiation noise countermeasures can be eliminated.

Embodiment 4

Figure 7:
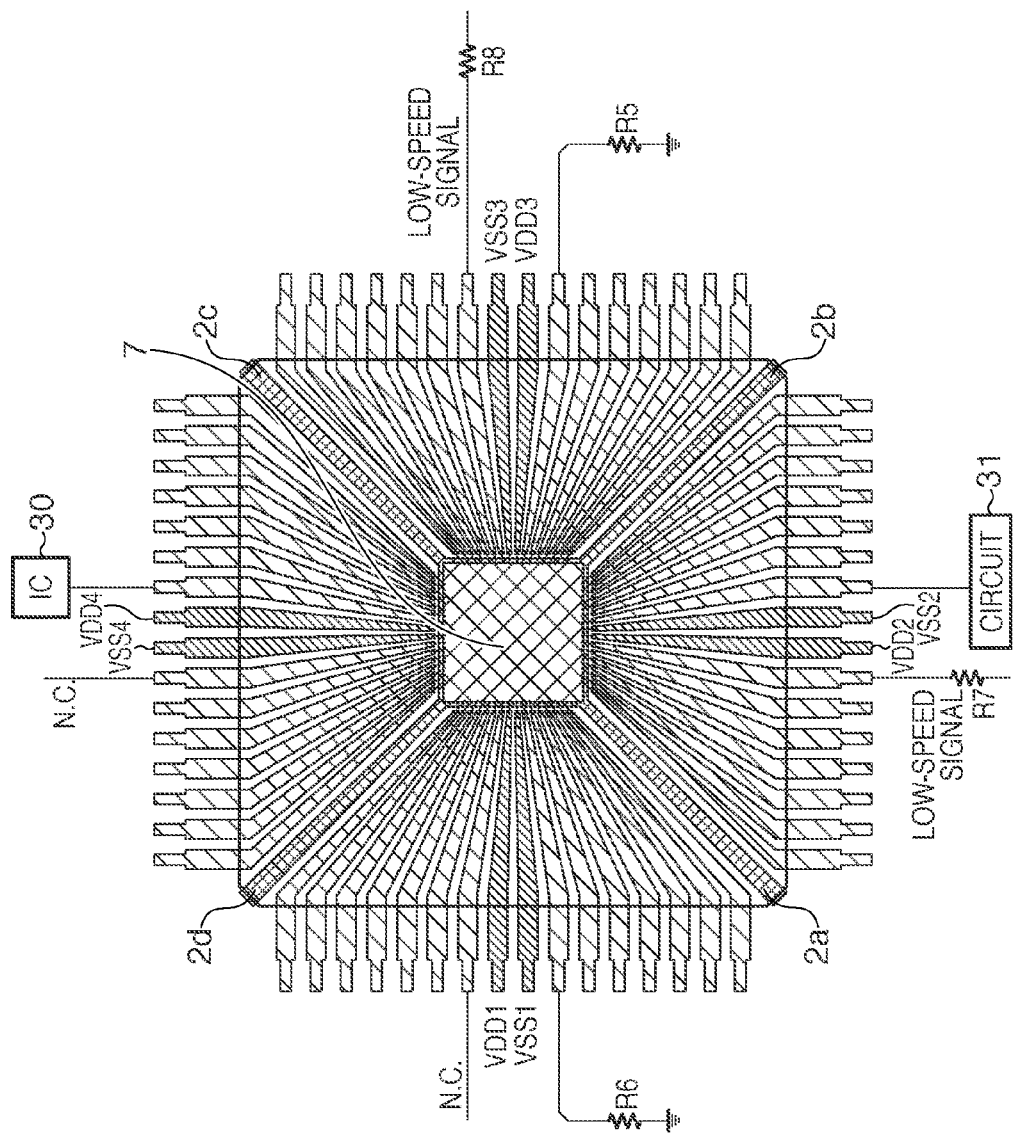
FIG. 7 is a diagram showing a semiconductor device according to Embodiment 4 and circuits that are connected thereto in a simplified manner.

A semiconductor device according to Embodiment 4 has a feature that signal lines connected to a circuit with a high input impedance or an element whose impedance can be easily set high are assigned to a power supply terminal for the inner core of the ASIC and a terminal adjacent to a GND terminal. FIG. 7 shows, in a simplified manner, the semiconductor device, and electric circuits and the like on a printed board to which the external lead terminals of the semiconductor device are connected by wiring. For convenience of the description, only some electric circuits connected to the semiconductor device are shown in a simplified manner, and other circuits are omitted. The description is simplified by giving the same reference numerals to the parts that have already been described.

First, a brief description is given on an increase in the instantaneous current generated at the power supply terminals for the inner core of the ASIC and the GND terminals. A semiconductor integrated circuit (hereinafter, referred to as IC) in recent years has been highly integrated due to miniaturization in process technology, and thus the scale of circuits mounted on a semiconductor chip has been dramatically increased. In particular, with the configuration of the semiconductor chip that is roughly divided into an inner core circuit and an I/O buffer portion, the degree of integration in the inner core circuit is becoming higher. As a result, the number of switching elements, such as complementary metal-oxide semiconductors that constitute the inner core circuit has been greatly increased, and the operation speed thereof continues to be increased every year. An enormous number of switching elements constituted in the inner core circuit repeatedly turn ON/OFF simultaneously at the clock frequency for causing the IC to operate, and thus instantaneous current is generated at the same timing. This instantaneous current is current that is charged and discharged from the power supply terminals connected to the inner core circuit and a decoupling capacitor (not shown) connected to the GND terminals.

VDD 1 to VDD 4 shown in FIG. 7 are power source (power supply) terminals for the inner core circuits of the ASIC, which is a semiconductor device. VSS 1 to VSS 4 are the GND (grounding) terminals for the inner core circuits. VDD 1 to VDD 4 and VSS 1 to VSS 4 belong to the first lead frame group, and are first lead frame pairs for power supply to a first circuit (inner core circuit), and grounding. In particular, the power supply terminals VDD 1 to VDD 4 and the GND terminals VSS 1 to VSS 4 are arranged in the center portion of each side.

As described in Embodiment 3 as well, the center portion of each side of the semiconductor device is where the length of inner leads can be set the shortest among inner leads on that side. Therefore, the value of a parasitic inductance in the center portion of a side is smaller compared to that in the corner portions of the side. That is, if the instantaneous current in the inner core circuit flows, the voltage drop that occurs is smaller at inner leads in the center portion of the side than the inner leads in the vicinity of the corner portions, and thus the noise level also becomes lower. The power supply terminals VDD 1 to VDD 4 and the GND terminals VSS 1 to VSS 4 for the inner core circuits are not signal lines that operate at a high frequency, such as the lead frames of the circuit block G described in Embodiments 2 and 3. However, due to instantaneous current that flows in the circuits integrated in the inner core circuit, high frequency current with the ASIC system clock frequency is flowing. The noise voltage in the high frequency band that becomes a problem of radiation noise is superimposed on this high frequency current. Accordingly, the inner leads adjacent or neighboring to the power supply terminals VDD 1 to VDD 4 and the GND terminals VSS 1 to VSS 4 for the inner core circuits are likely to be influenced by coupling of noise due to parasitic capacitance and mutual inductance.

In view of this, signal lines connected to circuits whose impedance can be easily set high are assigned to the lead frames adjacent and neighboring to the power supply terminals VDD 1 to VDD 4 and the GND terminals VSS 1 to VSS 4. Specifically, an N.C. signal, an IC 30, a circuit 31, resistors R5, R6, R7, and R8, and the like are connected to the lead frames that are adjacent and neighboring to the power supply terminals VDD 1 to VDD 4 and the GND terminals VSS 1 to VSS 4. Thus, at least either the terminals of at least two lead frames adjacent to the first lead frame pair or the terminals of at least two lead frames adjacent to a second lead frame pair are terminals that are not connected to anything (N.C.), terminals that are not connected to cables, terminals that are connected to circuits or elements whose input impedance is 470Ω or more, or terminals for output of a signal with a frequency of 100 kHz or less.

Thereby, high frequency noise can be suppressed from propagating to the printed board. Specific description of the circuits is the same as in Embodiment 2 and the like, and thus omitted. If high frequency noise that propagates to the printed board can be suppressed, spurious radiation from cables and the like can also be suppressed, which is as described above. Further, if such arrangement is adopted, the filter components for radiation noise countermeasures can also be eliminated.

Note that the internal module and the I/O cell that are provided within a semiconductor chip are physically divided into a plurality of circuit blocks, which is common to the above embodiments. Each of the circuit blocks is individually provided with pair wiring, which is a pair made by the power source wiring for power supply and the installation wiring for grounding. For example, first pair wiring that is constituted by first power source wiring and first grounding wiring is connected to the first circuit. Further, second pair wiring that is constituted by second power source wiring and second grounding wiring is connected to the second circuit. In this way, the first pair wiring and the second pair wiring are wired being separated from each other at least inside the semiconductor device, and thereby the influence of noise can be reduced.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-245931, filed Oct. 26, 2009, which is hereby incorporated by reference herein in its entirety.

What is claimed is:

1. A semiconductor device, comprising:
a first circuit including connection terminals configured to input or output a signal, wherein said first circuit is configured to operate at a first frequency;
a second circuit separated from said first circuit and including connection terminals configured to input or output a signal, wherein said second circuit is configured to operate at a second frequency lower than said first frequency;
a semiconductor chip including said first circuit and said second circuit;
a first lead frame group that is constituted by a first plurality of lead frames that are connected to said first circuit, terminals of said plurality of lead frames being provided on a first side of the semiconductor device;

a second lead frame group that is constituted by a second plurality of lead frames that are connected to said second circuit, terminals of said second plurality of lead frames being provided on a second side of the semiconductor device; and a suspension lead configured to suspend a die pad that supports said semiconductor chip, said suspension lead being arranged from a corner portion that is formed by said first side and said second side toward said semiconductor chip, wherein a group of the terminals of said first plurality of lead frames that are provided on said first side includes a terminal that is arranged closer to the corner portion than to a center portion of said first side and that is a terminal configured to input or output a signal with a high frequency.

2. The semiconductor device according to claim 1, wherein a part of said terminals of said lead frames of said second plurality of lead frames is also provided on said first side, and at least one terminal of said part of said terminals of said lead frames is a terminal to which a noise filter is connected, a terminal to which nothing is connected, a terminal that is not connected to a cable of a printed board on which the semiconductor device is implemented, a terminal to which a circuit or an element that has an impedance greater than or equal to a predetermined resistance value is connected, or a terminal for output of a signal with a frequency that is lower than or equal to a predetermined frequency.

3. The semiconductor device according to claim 2, wherein said part of said terminals of said lead frames of said second plurality of lead frames are adjacent or neighboring to, on said first side, said terminals of said lead frames that form said first plurality of lead frames.

4. The semiconductor device according to claim 1, further comprising:

first pair wiring that is constituted by first power source wiring and first grounding wiring that are connected to said first circuit; and second pair wiring that is constituted by second power source wiring and second grounding wiring that are connected to said second circuit, wherein said first pair wiring and said second pair wiring are wired being separated from each other at least inside the semiconductor device.

5. A printed board on which the semiconductor device according to claim 1 is mounted.

6. A semiconductor package, comprising:

a first circuit including connection terminals configured to input or output a signal, wherein said first circuit is configured to operate at a first frequency;

a second circuit separated from said first circuit and including connection terminals configured to input or output a signal, wherein said second circuit is configured to operate at a second frequency lower than the first frequency;

a semiconductor chip including said first circuit and said second circuit;

a first lead frame group that is constituted by a plurality of lead frames that are connected to said first circuit, terminals of said plurality of lead frames being provided on a first side of said semiconductor package; and a second lead frame group that is constituted by a second plurality of lead frames that are connected to said second circuit, terminals of said second plurality of lead frames being provided on a second side of said semiconductor package, wherein a corner portion is formed by said first side and said second side, and among a terminal group of said first lead frame group that is provided on said first side, a terminal arranged closer to said corner than to a center portion of said first side is a terminal configured to input or output a signal with a high frequency.

7. A semiconductor device, comprising:

a first circuit including connection terminals configured to input or output a signal with a first frequency;

a second circuit separated from said first circuit and including connection terminals configured to input or output a signal;

a semiconductor chip including said first circuit and said second circuit, wherein said second circuit is configured to operate at a second frequency lower than the first frequency;

a first lead frame group that is constituted by a plurality of lead frames that are connected to said first circuit; and a second lead frame group that is constituted by a plurality of lead frames that are connected to said second circuit, wherein said first lead frame group is provided on one side of the semiconductor device, and said second lead frame group is also provided on said one side of the semiconductor device, and wherein said first lead frame group is arranged in a center portion of said one side of the semiconductor device.

8. The semiconductor device according to claim 7, wherein said second lead frame group is arranged in an end portion of said one side of the semiconductor device.

9. A semiconductor package, comprising:

a first circuit including connection terminals configured to input or output a signal with a first frequency, wherein said first circuit is configured to operate at a first frequency;

a second circuit separated from said first circuit and including connection terminals configured to input or output a signal, wherein said second circuit is configured to operate at a second frequency lower than the first frequency;

a semiconductor chip including said first circuit and said second circuit;

a first lead frame that is connected to said first circuit; and a second lead frame that is connected to said second circuit, wherein said first lead frame is provided on one side of the semiconductor device, and said second lead frame is also provided on said one side of the semiconductor device, and wherein said first lead frame is arranged in a center portion of said one side of the semiconductor device.

10. The semiconductor package according to claim 9, wherein said second lead frame is arranged in an end portion of said one side.

11. A semiconductor device, comprising:

a first circuit including connection terminals configured to input or output a signal, wherein said first circuit is configured to operate at a first frequency;

a second circuit separated from said first circuit and including connection terminals configured to input or output a signal, wherein said second circuit is configured to operate at a second frequency lower than the first frequency;

a semiconductor chip including said first circuit and said second circuit;

a first lead frame that is constituted by a plurality of lead frames that are connected to said first circuit, and is provided on a first side of the semiconductor device;

a second lead frame that is constituted by a plurality of lead frames that are connected to said second circuit, and is provided on a second side of the semiconductor device; and a suspension lead configured to suspend a die pad that supports said semiconductor chip, said suspension lead being arranged from a corner portion that is formed by said first side and said second side toward said semiconductor chip, wherein said first lead frame is arranged closer to said corner portion than to a center portion of said first side.

12. A semiconductor package, comprising:

a first circuit including connection terminals configured to input or output a signal, wherein said first circuit is configured to operate at a first frequency;

a second circuit separated from said first circuit and including connection terminals configured to input or output a signal, wherein said second circuit is configured to operate at a second frequency lower than the first frequency;

a semiconductor chip including said first circuit and said second circuit;

a first lead frame that is connected to said first circuit and is provided on a first side of the semiconductor device; and a second lead frame that is connected to said second circuit and is provided on a second side of the semiconductor device, wherein said first lead frame is arranged on a corner portion side that is formed by said first side and said second side.

* * * * *